(12) United States Patent
Norem et al.

(10) Patent No.: US 8,463,342 B2
(45) Date of Patent: Jun. 11, 2013

(54) NANO-FABRICATED SUPERCONDUCTING RADIO-FREQUENCY COMPOSITES, METHOD FOR PRODUCING NANO-FABRICATED SUPERCONDUCTING RF COMPOSITES

(75) Inventors: James H. Norem, Downers Grove, IL (US); Michael J. Pellin, Naperville, IL (US)

(73) Assignee: Uchicago Argonne, LLC, Chicago, IL (US)

( * ) Notice: Subject to any disclaimer, the term of this patent is extended or adjusted under 35 U.S.C. 154(b) by 1283 days.

(21) Appl. No.: 12/246,223

(22) Filed: Oct. 6, 2008

(65) Prior Publication Data
US 2009/0312186 A1    Dec. 17, 2009

Related U.S. Application Data

(60) Provisional application No. 60/998,619, filed on Oct. 12, 2007.

(51) Int. Cl.
*H01P 1/203* (2006.01)
*H01P 11/00* (2006.01)
*H05H 9/00* (2006.01)
*H01L 39/24* (2006.01)

(52) U.S. Cl.
USPC ........... 505/210; 505/237; 505/310; 505/473; 315/5.41; 315/505; 313/62; 313/359.1; 333/99 S; 333/212; 333/227; 427/62; 427/248.1

(58) Field of Classification Search
USPC . 505/210, 237–238, 310, 470, 473; 315/5.41, 315/5.42, 500, 501, 503, 505; 313/62, 360.1, 313/359.1; 333/99 S, 212, 227; 148/96–98; 428/698–699, 701–702; 427/62, 123, 126.3, 427/250, 255.28, 248.1
See application file for complete search history.

(56) References Cited

U.S. PATENT DOCUMENTS

| 6,783,636 B2 * | 8/2004 | Iijima et al. ............... 204/192.11 |
| 2007/0069126 A1 * | 3/2007 | McIntyre ....................... 250/306 |

OTHER PUBLICATIONS

Pogue et al, "Polyhedral cavity structure for linac colliders," Particle Accelerator Conference, 2007, Albuquerque, NM. PAC. IEEE, Jun. 25-29, 2007; WEPMS002; pp. 2325-2327.*
Pellin et al, "ALD Capping Layers for Accelerator Superconducting Radio Frequency Cavities," ECS Transactions, 2007, V11 (7), pp. 23-28; Oct. 8, 2007.*
Gurevich, "Enhancement of rf breakdown field of superconductors by multilayer coating," Applied Physics Letters 88, 012511 2006.*
J. Norem, et al., "Dark current, breakdown, and magnetic field effects in a multicell, 805 MHz cavity", Physical Rev. Special Topics—Accelerators and Beams, vol. 6, (2003).

* cited by examiner

*Primary Examiner* — Stanley Silverman
*Assistant Examiner* — Kallambella Vijayakumar
(74) *Attorney, Agent, or Firm* — Cherskov Flaynik & Gurda LLC

(57) ABSTRACT

Superconducting rf is limited by a wide range of failure mechanisms inherent in the typical manufacture methods. This invention provides a method for fabricating superconducting rf structures comprising coating the structures with single atomic-layer thick films of alternating chemical composition. Also provided is a cavity defining the invented laminate structure.

22 Claims, 4 Drawing Sheets

NANO-FABRICATED SUPERCONDUCTING RADIO-FREQUENCY COMPOSITES, METHOD FOR PRODUCING NANO-FABRICATED SUPERCONDUCTING RF COMPOSITES

This utility application claims the benefits of U.S. Provisional Application No. 60/998,619 filed on Oct. 12, 2007.

CONTRACTUAL ORIGIN OF THE INVENTION

The United States Government has rights in this invention pursuant to contract number DE-AC02-06CH11357 between the U.S. Department of Energy and the University of Chicago representing Argonne National Laboratory.

BACKGROUND OF THE INVENTION

1. Field of the Invention

This invention relates to an improved method for preparing radio-frequency ("rf") accelerator cavities, and more particularly, this invention relates to an improved method for preparing high voltage-gradient superconducting rf cavities through controlled deposition of dielectric and superconducting materials.

2. Background of the Invention

Superconductors are metals that exhibit vanishing resistance at very low temperatures, i.e. temperatures a few degrees above absolute zero (0 degrees Kelvin). Typically, such temperatures are achieved by placing the metal in thermal contact with liquid Helium. Superconducting radio-frequency ("SCRF") cavities have been adopted throughout the world for the acceleration of particle beams, but SCRF cavities have not been able to routinely reach theoretically expected performance for a variety of reasons. As a result, accelerator designs have been increasing in complexity, cost, and length over the past decades, due to the inability to increase the accelerating voltage gradient of superconducting cavities over 30 MV/m (Million Volts/meter). The International Linear Collider (ILC) design, which is currently estimated to be about 20-25 miles long, is based on the limits of today's technology.

As shown in FIG. 1, a typical SCRF cavity designated as numeral 10 resembles a bellows conduit having alternations of constrictions 15 and recesses 19. An rf voltage generator induces an electric field inside the cavity such that electrons injected at an end 16 of the cavity are accelerated towards the other end 17. Typically the generator frequency is 1.3 GHz. Fabricated from heavy sheet metals, SCRF cavities have many surface imperfections and oxide layers, even after extensive cleaning procedures. As the rf-generated current is confined within roughly the first 100 nanometers of the cavity's surface, the main sources of cavity failure are these surface imperfections. Imperfections include protrusions (referred to herein as asperities), burrs, ridges, scratches, and other defects.

The inventors have found that high local fields result from small local radii of the imperfections. Where local radii of the asperities are larger, the local fields are smaller, and the cavities do not fail. Approximately, the local field E is inversely proportional to the local radius, thus $E \sim 1/r$.

The largest electric fields in a SCRF cavity are found near the constrictions 15 and the largest magnetic fields have circular field lines at the recesses 19 in planes perpendicular to the cavity axis α.

A SCRF cavity is first formed from superconducting material, such as niobium. Then, the inside of the structure is electropolished, cleaned and treated in a variety of ways. Finally, the structure is rinsed with high-pressure water. The structures so fabricated accommodate a maximum field of 30 MV/m at 1.3 GHz.

These and other typical superconducting structures fail as a result of a number of mechanisms, for example: 1) field emission (in which free electrons circulating in the highly conductive metal get pulled out of the metal's surface, generating discharges that can "short out" or overheat the structure), 2) quench fields, where the magnetic field exceeds the maximum field that the superconductor can support, 3) high field Q slope, where losses (due to magnetic oxides) degrade the ability of the cavity to store energy, 4) "multipactor", where resonant amplification of parasitic currents is caused by surface properties, 5) thermal effects (circulating current-heating of the material, thus causing stresses and deformation), 6) breakdown, where arcs are produced, 7) power and cryogenic load limits, 8) assembly defects and particulate generation, 9) Lorentz forces, where internal fields distort the structure, 10) microphonics, where external acoustic noise distorts the structure, and 11) local heating of hot spots.

Cavities fabricated from ordinary metals, such as copper, silver, stainless steel, can also fail at comparable gradients.

It is important that all of the above failure mechanisms be addressed in the search for higher gradient SCRF cavities.

A need exists in the art for a method to increase the energy gradient of SCRF accelerator cavities over the current limit of 30 MV/m. The method should provide economic benefits by making the ILC and other accelerators shorter, more power efficient, capable of reaching higher energies and by reducing construction and operating costs. The method should also enable the production of "table top" accelerators and smaller, high-gradient cavities compared to the size of cavities now used.

SUMMARY OF THE INVENTION

It is an object of the present invention to provide a method for the preparation of accelerator superconducting cavities that overcomes many of the disadvantages of the prior art.

A further object of the present invention is to provide a method for producing accelerator superconducting cavities with gradients as high as 100 MV/m. A feature of the invention is the serial application of one or several materials on an underlying substrate, whereby each of the layers is uniformly one molecule or atom thick. An advantage of the invention is the elimination of the elaborate cleaning and etching processes currently required when producing rf cavity surfaces. Another advantage of this invention is its use in situ, (i.e., when the cavity is already incorporated in an accelerator) so as to avoid contamination, and/or as part of ongoing maintenance.

Another object of the present invention is to provide superconducting accelerator cavities which are 50 percent shorter than typical structures producing similar acceleration. A feature of the invention covering a superconducting underlayment with layers of insulating material arranged in alternating configurations with layers of superconducting material. An advantage of the invention is that the insulating materials shield the superconducting underlayment from quenching magnetic fields while simultaneously directing oxygen from the original surface of the underlayment and into the bulk of the underlayment.

Briefly, the invention provides a radio-frequency accelerator cavity adapted to accommodate an accelerating voltage gradient between 30 MV/m and 100 MV/m, the cavity comprising a superconducting substrate defining a conduit; a dielectric layer covering interior surfaces of the conduit; a first superconducting layer covering said dielectric layer; and succeeding alternating dielectric and superconducting layers overlaying said first superconducting layer.

Also provided is a radio-frequency accelerator cavity adapted to accommodate an accelerating voltage gradient between 30 MV/m and 100 MV/m, the cavity comprising a superconducting substrate defining a conduit; a dielectric layer covering interior surfaces of the conduit; and a superconducting layer covering said dielectric layer.

The invention also provides a method for producing a superconducting radio-frequency accelerator cavity having a surface accelerating voltage gradient between 30 MV/m and 100 MV/m, the method comprising coating inner walls of the cavity with one or more materials with each of said materials deposited in one or more layers that are one atom thick. One or more of said materials may be chosen to be a superconductor and one or more of said materials may be chosen to be a dielectric.

The invention further provides a method for producing a radio-frequency accelerator cavity having a surface accelerating voltage gradient between 30 MV/m and 100 MV/m, said method comprising subjecting a superconducting substrate to a controlled atmosphere; coating the substrate with a dielectric so as to form a first layer on the substrate; and coating the first layer with a superconductor so as to form a surface having a root mean square roughness of less than 0.4 nanometer.

Specifically the present invention provides a method for producing a radio-frequency accelerator cavity having an accelerating voltage gradient between 30 MV/m and 100 MV/m., said method comprising reducing the following defects by the following means:

a) field emission, by conformal coating of the cavity to reduce local fields;
b) quench fields, where the magnetic field exceeds the maximum field that the superconductor can support, by depositing a plurality of monoatomic layers of predetermined materials;
c) high field Q slope, where the ability of the cavity to store energy is degraded, by controlling the chemical nature of the cavity surface;
d) resonant amplification of parasitic currents caused by surface properties, by controlling the chemical nature of the cavity surface;
e) heating of the material because of the circulating currents, by controlling the chemical nature of the cavity surface;
f) voltage breakdown, where arcs are produced, by conformal coating of the cavity to reduce local fields;
g) power and cryogenic load limits, by controlling the chemical nature of the cavity surface;
h) assembly defects and particulate generation, by in situ treatment of the cavity surface;
i) internal fields distorting the cavity, by applying predetermined coatings to the cavity surface that the cavity can be made more rigid than bulk niobium;
j) external acoustic noise distorting the cavity, by applying pre-determined coatings to the cavity surface so that the cavity surface can be made more rigid than bulk niobium; and
k) local heating of the cavity hot spots, by controlling the chemical nature of the cavity surface;

These coatings are applied so as to be uniform on an atomic scale and of a thickness approximately equal to the measured typical size of surface imperfections.

BRIEF DESCRIPTION OF THE DRAWING

The invention together with the above and other objects and advantages will be best understood from the following detailed description of the preferred embodiment of the invention shown in the accompanying drawing, wherein.

DETAILED DESCRIPTION OF THE INVENTION

Figure 1:
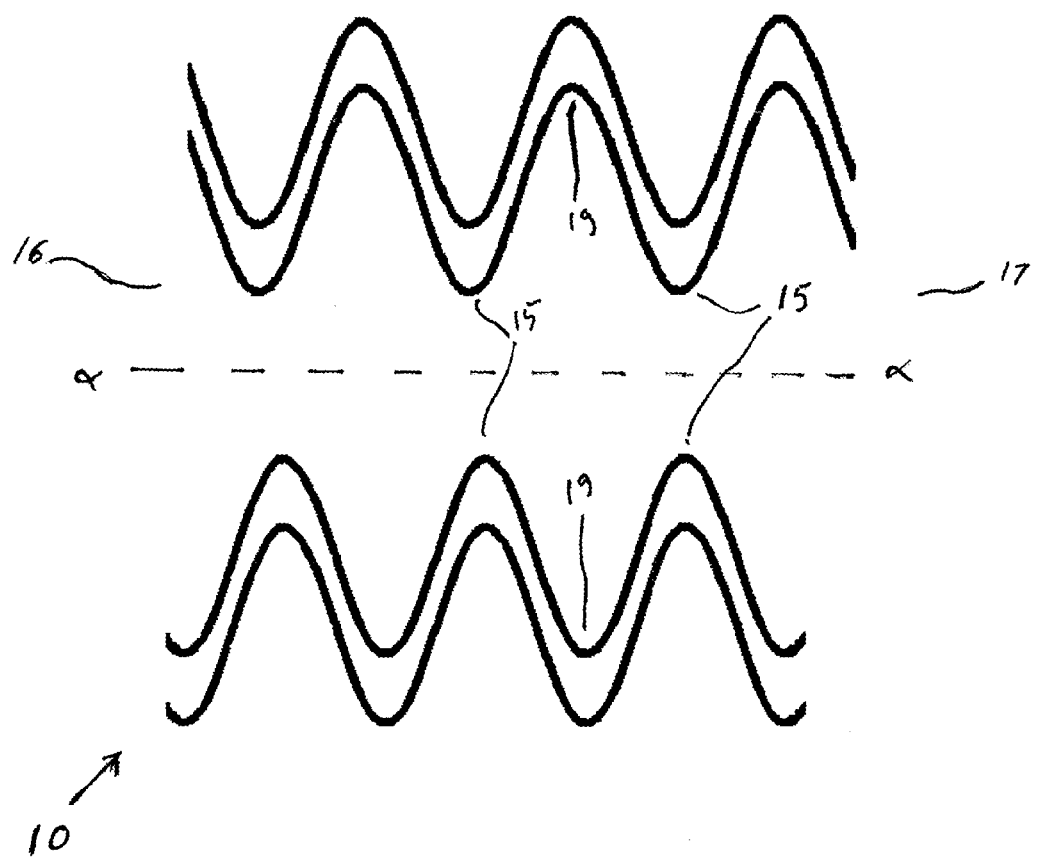
FIG. 1 is a schematic diagram of cross section of a surface of a radio-frequency accelerator superconducting cavity (SCRF)
Figure 2:
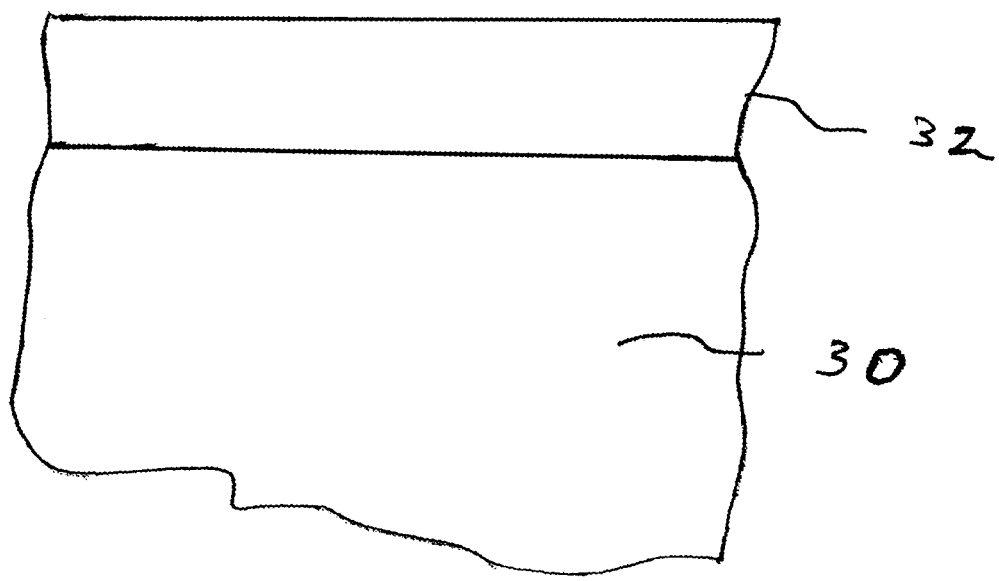
FIG. 2 is a schematic depiction of the results of prior art methods for producing superconducting radio-frequency (SCRF) cavities.

The present invention provides a radio-frequency accelerator cavity adapted to receive an accelerating voltage gradient between 30 MV/m and 100 MV/m. The cavity defines an interior surface or wall coated with one or more predetermined materials which minimize imperfections of the surface, so that the inner surface has a root mean square surface roughness of less than 0.4 nanometers.

The present invention also provides a method for producing a radio-frequency accelerator cavity having an accelerating voltage gradient between 30 MV/m and 100 MV/m. The method comprises coating said wall with one or more predetermined materials.

Once installed, these accelerator cavities must retain the same configuration to within one part in ten billion. A special advantage of the invented process is that if SCRF cavities are degraded through long-time use in an accelerator, the cavities could be repaired in situ without dismantling the accelerator and without bringing the cavities to atmospheric pressure. (For example, the accelerator can be built with appropriate attachments for application of the invented coating process).

A myriad of deposition means may be used, including but not limited to cluster ion beam (GCIB) smoothing, Dry Ice Cleaning (DIC), Electron Cyclotron Resonance (ECR) plasmas, and Atomic Layer Deposition (ALD).

ALD use in the instant protocol enables application of pin-hole free (i.e. continuous) coatings (as verified by measurements of electrical resistance of thin films with large surface areas) The coatings attain one nanometer thickness within a few seconds (i.e. between 1 and 5 seconds) after deposition begins.

Incorporating ALD in the instant protocol facilitates elimination of the aforementioned (a) through (k) eleven (11) failure modes of typically-fabricated cavities. For example, conformed coatings reduce local fields while exact control of the surface chemistries eliminates Q-slope, multipactor, load limit and local heating problems. In-situ deposition enabled by AFD allows for the formation of coatings after assembly thereby minimizing assembly defects, Lorentz effects, and acoustic noise problems.

Foundation Substrate and Overlaying Layer Detail

The present invention utilizes a plurality of sub-micron thick layers (in effect, laminates) which overlay superconductors, such as Type II elemental superconductors niobium, vanadium and technetium. Type II superconductors are preferable because they remain superconducting at higher ambient temperatures and magnetic fields. Alloys such as niobium tin, niobium titanium, niobium germanium, and niobium silicon and superconductors are also suitable as the superconductor foundation substrate.

In general, the substrate material should be able to reach the highest field possible without losses, defined by the lower critical field, $H_{c1}$. The materials used in the layers should be able to reach the highest fields obtainable, defined by $H_{c2}$. ($H_{c1}$ and $H_{c2}$ are defined as follows: When the magnetic field is below $H_{c1}$, no magnetic fields can penetrate in the superconductor. Above $H_{c1}$ and below $H_{c2}$, some magnetic field can penetrate in the superconductor. Above $H_{c2}$, the material loses its superconductivity).

Figure 3:
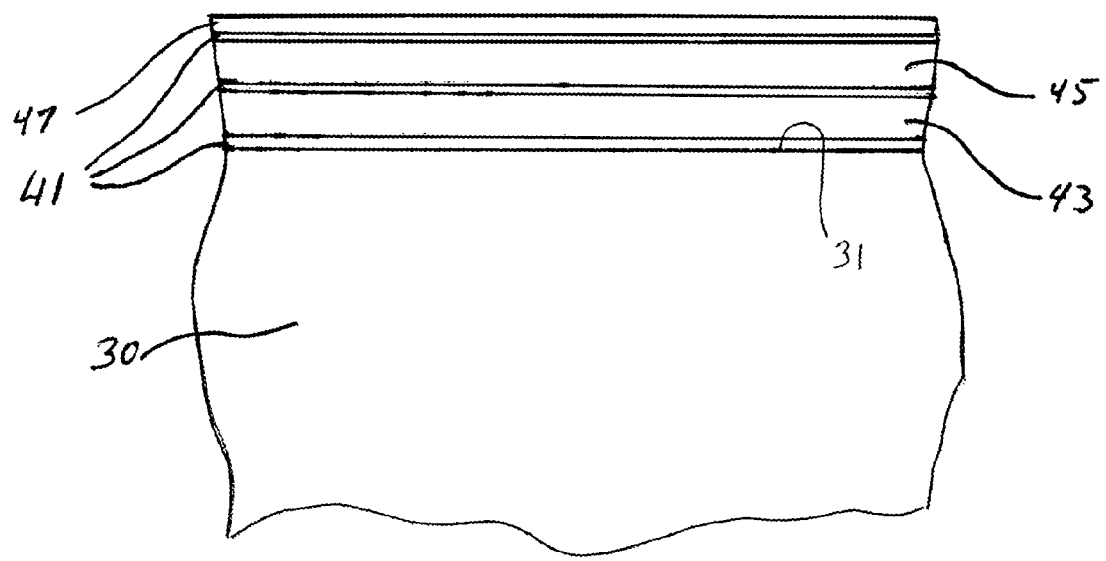
FIG. 3 is a schematic depiction of the results of the invented method for producing superconducting radio-frequency (SCRF) cavities, in accordance with features of the present invention.

Deposition of layers on top of the foundation substrate is facilitated with the use of commercial grade pure gases, to ensure that no contamination is present. An exemplary embodiment is depicted in FIG. 3, which shows a typical superposition of laminates deposited on a substrate 30 of bulk superconductor. In one illustrative embodiment, the laminate structure comprises a layer 43 of active Niobium, a layer 45 of $MgB_2$, where the $MgB_2$ screens or otherwise isolates the substrate from the alternating magnetic fields, a multipactor suppression layer 47 of TiN, and insulator layers 41 that stop diffusion of ions (including hydrogen, oxygen, and nitrogen) from one laminate into another.

Any superconducting material with a higher $H_{c2}$ greater than Niobium is suitable as a means for isolating the underlying substrate from alternating magnetic fields. As such, compounds including, but not limited to, $MgB_2$, $Nb_3Sn$, $V_3Si$, $Nb_3Ge$, $Nb_3Si$ and combinations thereof are such materials.

Any compound with a secondary emission coefficient less than one (i.e. producing fewer electrons than are absorbed) is a suitable multipactor suppression agent. As such, compounds including, but not limited to, TiN, Nb2O5, In2O3, SnO2, ZnO and combinations thereof are suitable candidates.

The invented insulating/superconducting layers combination, and method for producing same, provides a means for protecting (filtering) the underlying foundation substrate from high rf magnetic fields that would otherwise quench the superconductor at a field of about 0.2 Tesla. Instead, the collective effect of the invented layer combination provides insulation up to 1 T.

FIG. 3 also illustrates another embodiment of the invention where a substrate 30 defines a superconducting surface 31. A plurality of layers 43, 45, 47 of a high-temperature superconductor such as NbN, or $NB_3Sn$ overlay the foundation surface 31. An Iron Nictide ($Ba_{1-x}K_xFe_2As_2$) may also be used for that purpose. Intermediate the layers 43, 45, 47 are positioned one or more layers 41 of an insulator.

A myriad of dielectric materials can comprise the insulating layer, including, but not limited to, $Al_2O_3$, $Nb_2O_5$, $SiO_2$, $HfO_2$ and combinations thereof.

The ALD process conformally coats asperities and other features of the foundation surface 31. The coatings over these features comprises uniform, well characterized material with known properties (insulator, conductor, superconductor), Also, the coatings provide a means for smoothing the system, akin to snow on a rock pile, so as to make the surface "nanosmooth" (i.e. smooth on a scale of a few nanometers), pure, homogenous, continuous and insulating.

The coatings provide a means for smoothing-out the projections so as to transform the small radii of the projections to large radii (concomitantly producing low fields), to make them failure proof. The inventors found that many of the asperites are semi-spherical and have radii of from 10 nm to 30 nm. Generally, transforming asperities to define radii greater than 100 nm (i.e., 3 to 10 times the original asperite radii size) will produce the desired low field effect. Low fields are those less than $10^9$ V/m. Smoothing out of asperities and other features typically requires coating thicknesses of coatings in the 20-100 nm range.

The precise nature of the invented deposition configuration makes it able to simultaneously attack all of the aforementioned failure modes seen in prior art systems. Also it allows coating after assembly. Furthermore, the resulting constructs exhibits lower regenerated heating and better thermal properties.

The inventors have measured the diameters of the asperities that cause field emission and breakdown events in accelerator cavities and found that they are on the order of 10-100 nm, prevalently in the 20 to 60 nm range, with most of the field emission being produced by asperities with a diameter of less than 100 nm. As such, optimal coating parameters have been deduced from these measurements. Details of these measurements are found in J. Norem et al, "Dark current, breakdown, and magnetic field effects in a multicell, 805 MHz cavity." *Physical Rev. Special Topics—Accelerators and Beams*, Vol. 6, 072001 (2003), incorporated herein by reference. Typical height "h" of an asperity is approximately equal to or smaller than its diameter "d", i.e between 20 and 60 nm, and rarely exceeds 100 nm. High field conditioning of a cavity decreases the number of asperities and their size.

Figure 4:
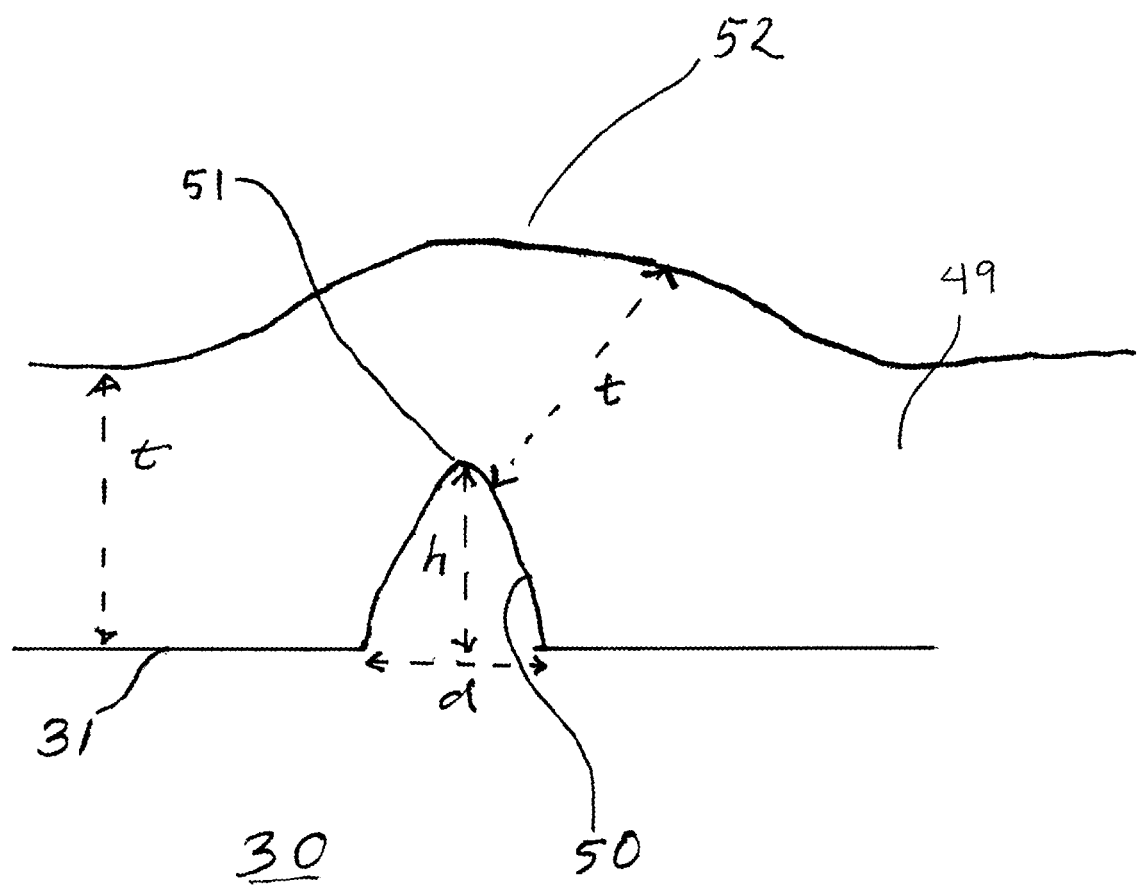
FIG. 4 is a schematic depiction of the coating of a surface imperfection by means of the invented method for producing superconducting radio-frequency (SCRF) cavities, in accordance with features of the present invention.

FIG. 4 is a schematic of the invented deposition process where in a single layer 49 is deposited on a substrate 30 that defines a superconducting surface 31. For instance, the layer 49 may be a coating of Niobium on a substrate of Niobium, where the coating is applied to smooth out asperities or contaminants such as the asperity 50 of height h and diameter d. (Typically d and h are equal to each other within a factor of two). The coating layer has a thickness t that is approximately equal to the height h or greater than h. Generally, the tip 51 of the asperity 50 has a smaller radius of curvature than the portion 52 of the over-coating positioned above the tip 51. This portion has a radius of curvature approximately equal to t.

Inasmuch as the local field E at each of these tips is inversely proportional to the radius of curvature, the deposition of the layer 49 results in a much smaller local field E. This smaller local field E allows the accelerator cavity to sustain a much larger accelerating voltage gradient.

Generally, good results are obtained as long as the coating 49 covers the asperity 50. Preferably, a coating thickness t of between h/10 to h is used. Most preferable configurations are with t equal to or greater than h/2, such that a coating exists over the tip 51 of the asperity that is as thick as h/2. Given that asperities have heights in the 20 to 100 nm range, a coating of 20 to 100 nm thickness allows a high accelerating voltage gradient.

In fact, one can first measure the surface properties of an accelerator cavity using methods such as those described in J. Norem et al. (see supra) and from these measurements determine the materials and thicknesses to be deposited.

A salient feature of this invention is that the deposits can be multi-layered, so as to filter quench fields. The deposits are pure enough so that high field "Q slope" effects (due to scattering from magnetic oxide contaminations near the surface) are avoided and the ability of the cavity to store energy is maintained. The deposited layers can be covered with monolayers of a film (e.g. dry oxide, TiN) having much lower secondary emission coefficients to prevent the occurrence of multipacting and other effects.

Generally, insulator layers are positioned between the superconducting surface. This arrangement shields the primary current carrying elements from quench fields.

Conformal characteristics of the coatings produced by the method enable in-situ deposition in existing structures, both to minimize assembly defects and to repair defects. The interiors of long narrow tubes have already been coated. The ratio length to diameter of these tubes is about 5,000 LTD (length to diameter), comparable to the (underperforming) SNS linear accelerator ("linac").

Deposition Detail

The invented process enables deposition rates on the order of one micron (micrometer, µm) per hour. Moreover it is a parallel, non-line-of-sight, conformal coating technique. This technique allows the growth of films on complex cavity structures. The materials are covalently bonded to the surface substrate and other layers. ALD is unique in that it allows the deposition of a layer that is uniform on an atomic scale covering the entire inner surface of a structure.

Thickness control to the single-atomic-layer level is easily achieved with ALD. It is similar in chemistry to chemical vapor deposition (CVD), except that the ALD reaction breaks the CVD reaction into two half-reactions, keeping precursor materials separate during the reaction. ALD film growth on the sc cavity underlayment is self-limiting and based on surface reactions, which makes achieving atomic-scale deposition control possible. By keeping the precursors separate throughout the coating process, atomic layer control of film growth as fine as −0.1 angstroms per monolayer can be obtained. The coating is applied to all exposed portions of the cavity surfaces, so that there is no field penetration at the corners or edges of the cavity.

The invented protocol can be performed at or near room temperature (i.e. from 100° C. to 250° C.). The temperature at which ALD is performed depends on the specific reactions that are utilized, with reaction rates changing by roughly a factor of 2 for every 10 degrees Fahrenheit. Preferably, the depositions occur at roughly 100-200 degrees Celsius with the underlying cavity structure heated prior to deposition. Capping or insulating layers are be applied to protect the final surface (i.e., surface exposed to the accelerated plasma) from impurities coming from the surface of the bulk material. Only the top monolayers (from 100 nm to 1000 Angstroms) of the resulting construct participate in the gradient. The surface is pin-hole free and can be reproduced precisely.

Protocol Detail

An embodiment of the invented method for coating a predetermined material onto the inner walls of a chamber comprises:

a) contacting the walls with a fluid at the same temperature as the walls that contains a first precursor chemical of the coating material so as to facilitate attachment of the first precursor to the walls;

b) purging excess first precursor molecules from the chamber, the purging facilitated with a non-reacting gas such as nitrogen, helium, neon, or argon;

c) contacting the first precursor contacted walls with a fluid at the same temperature as the walls that contains a second precursor chemical such that the second precursor reacts with the first precursor chemical to form a single-molecule layer of the predetermined material on the wall of the chamber; and d) purging all remaining matter from the cavity.

Steps (a) through (d) are repeated in sequence until a desired thickness of deposited materials is achieved.

Typically, the cavity is evacuated before step (a) and the fluid is a gas at a pressure of between 0.0001 and 0.01 atmospheres, and preferably at approximately 0.001 atmospheres.

Insulator Layer Detail

To make an insulator layer of alumina, Al2O3, a precursor chemical such as trimethylaluminum (TMA) is injected into the system and for a time and at a temperature to allow the TMA molecules bond to the substrate. Excess molecules are purged with a nonreacting gas, such as, but not limited to, nitrogen or noble gases (e.g. He, Ar, Ne). Next, water vapor is injected and reacts with the TMA to form a singlemolecule layer of $Al_2O_3$ on the substrate while $CH_4$ (methane) gas is released. The latter is then purged from the chamber with a nonreacting gas (as defined supra). The process is then repeated until a pre-determined thickness is achieved.

In practice the reacting and nonreacting gasses are evacuated from one end of the reactor tube to enable a continuous flow of gas over surfaces to be coated.

The inventors' experiments have shown that thin (3–10 nm) layers $Al_2O_3$ are impervious to air. The TMA exposures for $Al_2O_3$ in the ALD process tend to chemically reduce Nb oxide given that the Aluminum extracts the oxygen from the niobium due to the former being more active. One can further heat treat Nb at a higher temperature (500-800° C.) and modify the niobium oxide.

Oxygen atoms that have not reacted with aluminum diffuse into the bulk of the niobium, and the alumina prevents oxygen penetrating the superconducting layers from the air. A variety of additional coatings can be applied to insure that secondary emission coefficients are below unity. Thus, the capping film reduces two different types of usual SCRF problems. As alumina surfaces may be subject to multipacting, another layer of superconducting material on the $Al_2O_3$ layer can be applied. Annealing of a $Al_2O_3$ capped surface at a temperature of approx. 500° C. (a form of high temperature annealing) decreases the incidence of magnetic scattering in the medium.

Example

An embodiment of the present invention is a coating layer of alumina, $Al_2O_3$, several molecules thick to cover a niobium surface with a chemically impermeable insulator. Next a layer of niobium fluoride is deposited on the alumina surface, and then another layer of alumina is deposited to protect the niobium from oxidation. Alumina is a good thermal conductor, a good electrical conductor, and resists oxidation. The first layer of alumina will permit any oxygen attached to the niobium substrate to migrate into the interior of the substrate and mitigate any decline in material properties. The surface with a combination of alumina/niobium fluoride/alumina on bulk niobium enables the resulting construct to operate at significantly higher fields than have been seen in any existing rf structure.

Other materials, such as magnesium diboride as a superconducting layer, and additional layers of alumina, are added to provide different properties. The inventors found that vortexes, which increase the losses in the superconducting path, are eliminated when the layers of superconductor are too thin to stably maintain them.

The quality of the films is monitored with measurements using ellipsometry, x-ray photoelectron spectroscopy, Atom Probe Tomography, SIMS, point contact tunneling, and other techniques. The inventors have conducted experiments showing that the presence of magnetic oxides can contribute to superconducting loss mechanism and, using point contact tunneling, they have shown the thermal dependence of this loss.

The inventors have conducted extensive tests of the superconducting properties of ALD coatings using point contact tunneling. The testing of properties of ALD coatings of single rf cells comprises rf measurements of a cell before and after coating. In addition to the tests on complete cells, point contact tunneling measurements determine the properties of the superconductors at the interface between the bulk niobium and the oxide layer.

Tests have experimentally verified that ALD can grow coatings of alumina which are 10 molecules thick on superconducting niobium. Such layers have been shown to protect the niobium from oxidation in air, and in fact, reduce the niobium concentration on the surface. Heating this composite at 450° C. drives any oxygen present on the surface into the bulk material, thereby producing a clean niobium/alumina interface. Subsequent tests have shown that it is possible to overcoat the alumina with titanium nitride, which would permit the composite to be used in high power tests without multipactoring (parasitic secondary electron emission).

Thus, while superconducting rf cavities were limited heretofore by a wide range of failure mechanisms, synthesizing films to overlay superconducting surfaces cures the above defects.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

The invention claimed is:

1. A radio-frequency accelerator cavity adapted to accommodate an accelerating voltage gradient between 30 MV/m and 100 MV/m, the cavity comprising:
   a) a superconducting substrate defining a conduit;
   b) a uniform dielectric layer covering interior surfaces of the conduit;
   c) a uniform first superconducting layer covering said dielectric layer; and
   d) succeeding alternating uniform dielectric and superconducting layers overlaying said first superconducting layer, wherein the uniform dielectric and superconducting layers are substantially free of pinhole defects and are substantially continuous.

2. The cavity as recited in claim 1 wherein one or more of said superconducting layers is a Type II superconductor.

3. The cavity as recited in claim 1 wherein said cavity has an inner surface with a root mean square surface roughness of less than 0.4 nanometers.

4. The cavity as recited in claim 1 wherein said superconducting layers are selected from the group consisting of niobium, technetium, vanadium, alloys of niobium, alloys of vanadium, and alloys of technetium.

5. The cavity as recited in claim 1 wherein said dielectrics are chosen from the group consisting of $Al_2O_3$, $MgB_2$, TiN, $Nb_2O_5$, $SiO_2$, $HfO_2$ and combinations thereof.

6. The cavity as recited in claim 1 wherein one or more of said dielectrics and said materials are epitaxial.

7. The cavity as recited in claim 1 wherein substrate is coated with layered structures with alternating dielectric and superconductor layers chosen from the group consisting of Nb, $Al_2O_3$, $MgB_2$, TiN, NbN and combinations thereof.

8. A radio-frequency accelerator cavity adapted to accommodate an accelerating voltage gradient between 30 MV/m and 100 MV/m, the cavity comprising:
   a) a superconducting substrate defining a conduit;
   b) a uniform dielectric layer covering interior surfaces of the conduit; and
   c) a uniform superconducting layer covering said dielectric layer, wherein the uniform dielectric and superconducting layers are substantially free of pinhole defects and are substantially continuous.

9. The cavity as recited in claim 8 wherein said dielectric is $Al_2O_3$ and said superconductor is Niobium.

10. A method for producing a superconducting radio-frequency accelerator cavity having an accelerating voltage gradient between 30 MV/m and 100 MV/m, said method comprising coating inner walls of the cavity with one or more materials with each of said materials deposited in one or more uniform layers that are one atom thick and are substantially continuous and pinhole free.

11. The method as recited in claim 10 wherein one or more of said materials is a dielectric.

12. The method as recited in claim 10 wherein one or more of said materials is a superconductor.

13. The method as recited in claim 10 further comprising measuring properties of said accelerator cavity at a high accelerating voltage gradient and determining the coatings to be applied on the basis of said measurements.

14. A method for producing a radio-frequency accelerator cavity having a surface accelerating voltage gradient between 30 MV/m and 100 MV/m, said method comprising:
   a) subjecting a superconducting substrate to a controlled atmosphere;
   b) coating the substrate with a dielectric so as to form a uniform first layer on the substrate; and
   c) uniformly coating the first layer with a superconductor so as to form a surface with a root mean square roughness of less than 0.4 nanometer.

15. The method as recited in claim 14, said coating steps comprising:
   a) contacting walls of said cavity with a fluid containing a first precursor chemical of the coating material so as to facilitate attachment of the first precursor to the walls;
   b) purging excess first precursor molecules from the cavity, with the purging facilitated with a non-reacting gas such as nitrogen, helium, neon, or argon;
   c) contacting the first precursor contacted walls with a fluid containing a second precursor chemical such that the second precursor reacts with the first precursor chemical to form a single-molecule layer of the predetermined material on the wall of the chamber; and
   d) purging all remaining matter from the cavity.

16. The method as recited in claim 15 wherein said steps of
   a) contacting walls of said cavity with a fluid containing a first precursor chemical of the coating material so as to facilitate attachment of the first precursor to the walls;

b) purging excess first precursor molecules from the cavity, the purging facilitated with a non-reacting gas such as nitrogen, helium, neon, or argon;

c) contacting the first precursor contacted walls with a fluid containing a second precursor chemical such that the second precursor reacts with the first precursor chemical to form a single-molecule layer of the predetermined material on the wall of the chamber; and d) purging all remaining matter from the cavity are repeated in sequence until a desired thickness of deposited materials is achieved.

17. The method as recited in claim 14 wherein a one nanometer thick, hole-free coating is applied within in 30 seconds.

18. The method as recited in claim 14 wherein said controlled atmosphere is at a temperature of between 26° C. and 200° C.

19. The method as recited in claim 14 wherein said dielectric layer is between 3 and 100 nm thick.

20. The method as recited in claim 14 wherein said dielectric is coated with a superconductor between 3 and 100 nm thick.

21. The method as recited in claim 14 wherein one or more of said superconductors and dielectrics are epitaxial.

22. The method as recited in claim 14 wherein said said superconductors and dielectrics are deposited one atomic layer at a time.

* * * * *

UNITED STATES PATENT AND TRADEMARK OFFICE
CERTIFICATE OF CORRECTION

| | |
|---|---|
| PATENT NO. | : 8,463,342 B2 |
| APPLICATION NO. | : 12/246223 |
| DATED | : June 11, 2013 |
| INVENTOR(S) | : James H. Norem et al. |

It is certified that error appears in the above-identified patent and that said Letters Patent is hereby corrected as shown below:

In the Specifications:

On column 6, line 11, delete "regenerated" and replace with "rf-generated".

Signed and Sealed this
Twenty-third Day of July, 2013

Teresa Stanek Rea
*Acting Director of the United States Patent and Trademark Office*